United States Patent

Huang

(10) Patent No.: US 8,295,117 B2
(45) Date of Patent: Oct. 23, 2012

(54) MEMORY POWER SUPPLY CIRCUIT

(75) Inventor: Wei-Lung Huang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 156 days.

(21) Appl. No.: 12/939,187

(22) Filed: Nov. 4, 2010

(65) Prior Publication Data

US 2012/0106284 A1    May 3, 2012

(30) Foreign Application Priority Data

Oct. 28, 2010  (TW) ................................ 99136959 A

(51) Int. Cl.
*G11C 5/14* (2006.01)
(52) U.S. Cl. ......... 365/226; 365/227; 365/228; 365/229
(58) Field of Classification Search .................. 365/226, 365/227, 228, 229
See application file for complete search history.

(56) References Cited

U.S. PATENT DOCUMENTS

| | | | |
|---|---|---|---|
| 7,294,976 B1 * | 11/2007 | Andric et al. | 315/291 |
| 7,548,466 B2 * | 6/2009 | Park et al. | 365/189.09 |
| 7,804,733 B2 * | 9/2010 | Alexander et al. | 365/226 |
| 7,872,924 B2 * | 1/2011 | Ma | 365/189.05 |

\* cited by examiner

*Primary Examiner* — Pho M Luu
(74) *Attorney, Agent, or Firm* — Altis Law Group, Inc.

(57) ABSTRACT

A memory power supply circuit includes a memory module, a micro control unit (MCU), a phase switch circuit, and a multi-phase pulse-width modulation (PWM) controller. The MCU is operable to determine required current to be supplied to the memory module and output corresponding phase switch signals to the phase switch circuit. The PWM controller includes a number of phase pins connected to the phase switch circuit. The phase switch circuit controls enable states of the phase pins of the PWM controller.

4 Claims, 2 Drawing Sheets

MEMORY POWER SUPPLY CIRCUIT

BACKGROUND

1. Technical Field

The present disclosure relates to a memory power supply circuit.

2. Description of Related Art

Memory components or chips (hereinafter memory chips) are installed in motherboards of computers or servers. The number and type of the memory chips can be adjusted according to requirements. When the number or type of the memory chips is changed, current supplied to the memory chips needs to be correspondingly changed. In a common memory power supply circuit, a multi-phase pulse-width modulation (PWM) controller is provided to change the current through adjusting enabled phase pins of the PWM controller. Namely, if the number of the enabled phase pins is increased, the current is increased correspondingly, and if the number of the enabled phase pins is decreased, the current is correspondingly increased. However, the PWM controller must enable all of the phase pins before adjustment thereby electricity may be wasted.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
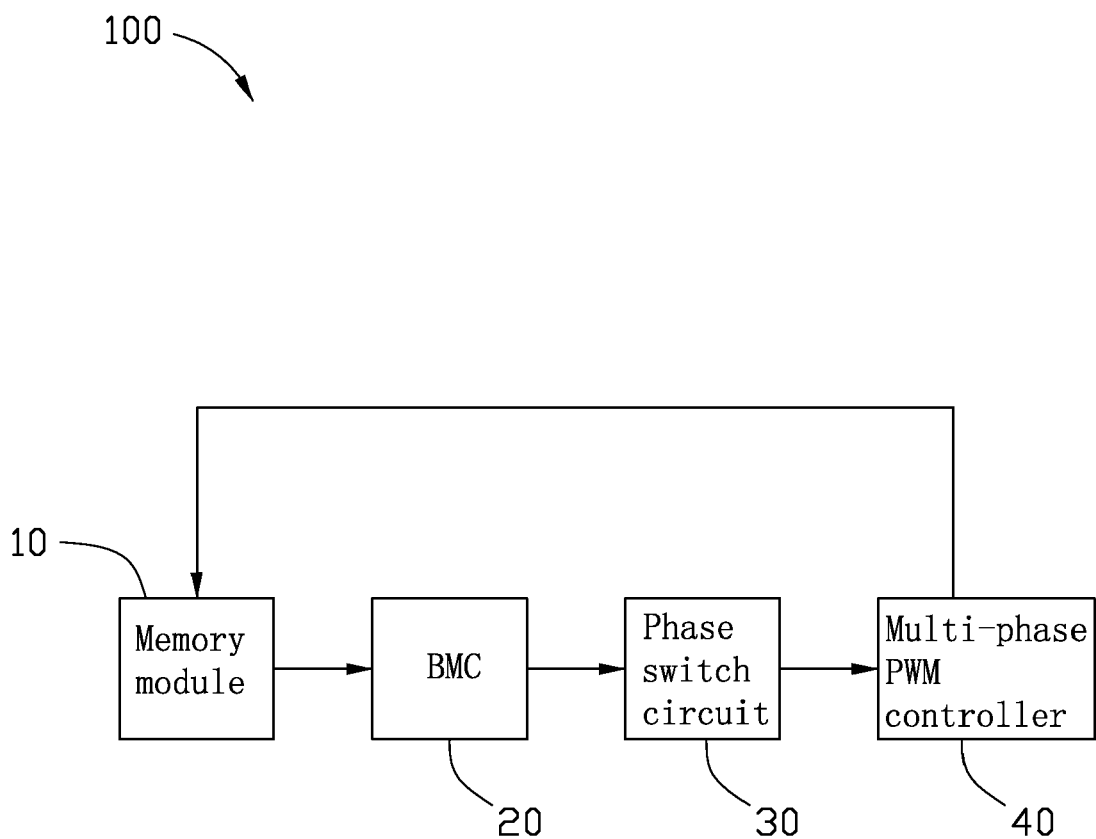
FIG. 1 is a block diagram of an embodiment of a f power supply circuit.

Referring to FIG. 1, an embodiment of a memory power supply circuit 100 includes a memory module 10, a baseboard management controller (BMC) 20, a phase switch circuit 30, and a multi-phase pulse-width modulation (PWM) controller 40.

The memory module 10 includes at least one memory chip (not shown) each having a serial presence detect (SPD) chip used to save parameters of the corresponding memory chip. The BMC 20 is connected to the memory module 10, to receive the parameters of the at least one memory chip and determine the required current to be supplied to the memory module 10 according to the parameters of the at least one memory chip, and then output at least one phase switch signal to the phase switch circuit 30. In other embodiments, the BMC 20 can be substituted by a basic input output system (BIOS) chip or other kinds of micro control units (MCU) or firmware.

The phase switch circuit 30 is connected between the BMC 20 and the PWM controller 40, and used to receive the at least one phase switch signal of the BMC 20 to correspondingly switch phases of the PWM controller 40. The number of the phases of the PWM controller 40 can be designed according to requirements, such as three or more. For easy description, FIG. 2 only show one kind of PWM controller 40 which has three phase pins 1PH, 2PH, and 3PH, such as an ISL6309 three-phase PWM controller 40. The number of the at least one phase switch signal of the BMC 20 is less than the number of the phase pins of the PWM controller 40 by one. Each phase switch signal of the BMC 20 enables or disables a corresponding phase pin of the PWM controller 40 through the phase switch circuit 30. The extra one phase pin (1PH in FIG. 2) of the PWM controller 40 is always enabled by itself to make sure the PWM controller 40 outputs current anytime and is not controlled by any phase switch signal of the BMC 20.

Figure 2:
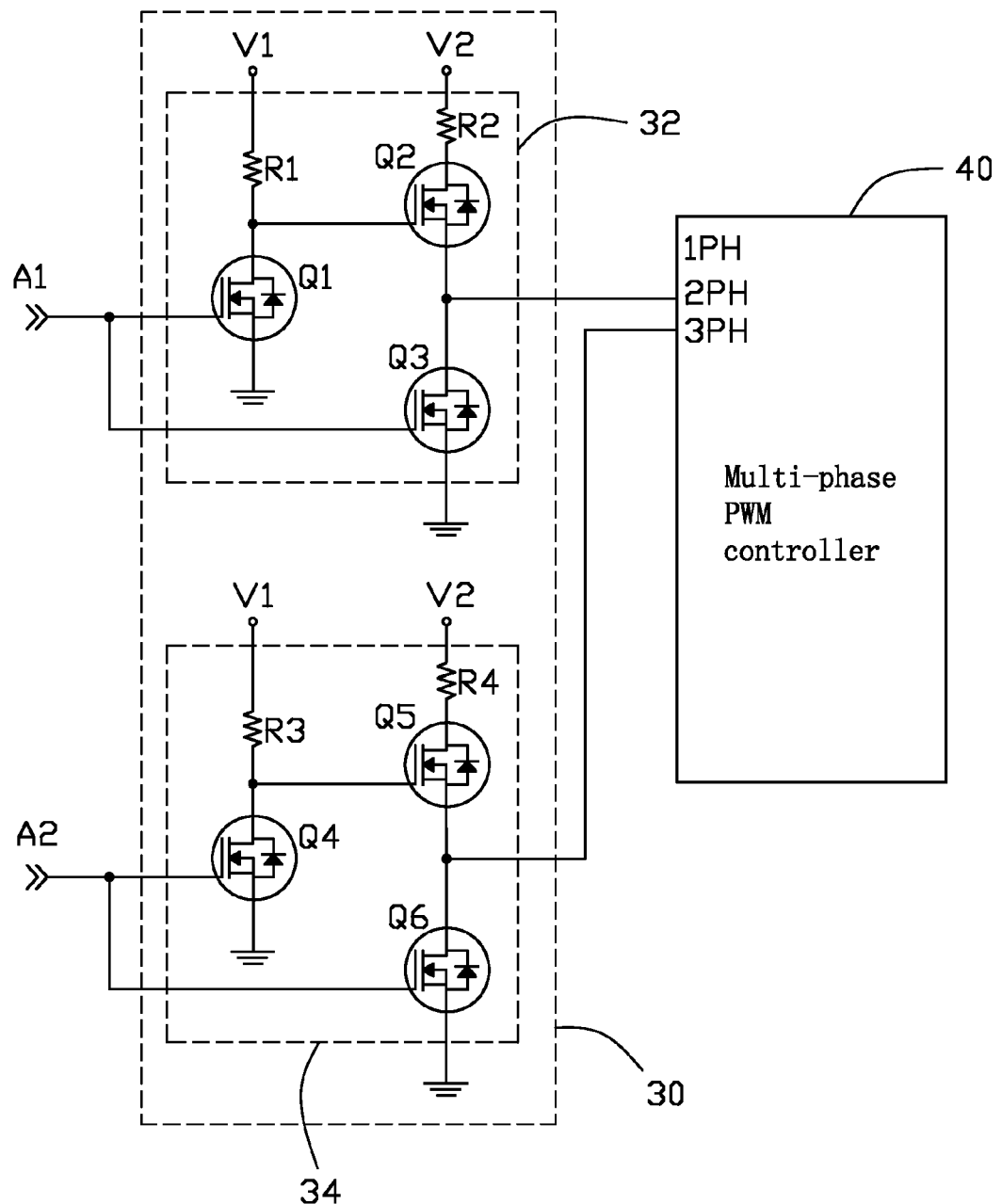
FIG. 2 is a partial circuit diagram of the memory power supply circuit of FIG. 1.

Referring to FIG. 2, the PWM controller 40 has three phase pins 1PH, 2PH, and 3PH, therefore the BMC 20 outputs two switch signals, such as a first phase switch signal A1 and a second phase switch signal A2, to the phase switch circuit 30. The phase switch circuit 30 includes a first sub-switch circuit 32 and a second sub-switch circuit 34. The first sub-switch circuit 32 includes first to third electronic switches Q1-Q3, a first resistor R1, and a second resistor R2. In one embodiment, the first to third electronic switches Q1-Q3 are n-type field-effect transistors (FETs). First terminals of the first and third electronic switches Q1 and Q3 are connected to the BMC 20 to receive the first phase switch signal A1. Second terminals of the first and third electronic switches Q1 and Q3 are grounded. A third terminal of the first electronic switch Q1 is connected to a first terminal of the second electronic switch Q2, and connected to a first voltage terminal V1, such as 5 volts (V), through the first resistor R1. A second terminal of the second electronic switch Q2 is connected to a third terminal of the third electronic switch Q3, and connected to the phase pin 2PH of the PWM controller 40. A third terminal of the second electronic switch Q2 is connected to a second voltage terminal V2 through the second resistor R2. The first to third terminals of the first to third electronic switches Q1-Q3 are corresponding to the gates, sources, and drains of the n-type FETs.

The second sub-switch circuit 34 includes fourth to sixth electronic switches Q4-Q6, a third resistor R3, and a fourth resistor R4. The connection relationship among the fourth to sixth electronic switches Q4-Q6, the third resistor R3, and the fourth resistor R4 is the same to the connection relationship among the first sub-switch circuit 32. First terminals of the fourth and sixth electronic switch Q4 and Q6 are connected to the BMC 20 to receive the second phase switch signal A2. A second terminal of the fifth electronic switch Q5 is connected to the phase pin 3PH of the PWM controller 40. The phase pin 1PH of the PWM controller 40 is always enabled by itself, which falls within well-known technologies, and is therefore not described here. The number of the sub-switch circuits of the phase switch circuit 30 and the number of the phase switch signals of the BMC 20 are the same. Namely the sub-switch circuits of the phase switch circuit 30 respectively receive the phase switch signals of the BMC 20, and are respectively connected to the phase pins of the PWM controller 40 except the extra one of the phase pins.

In the first sub-switch circuit 32, when the first phase switch signal A1 is a high voltage signal, such as 5V, the first and third electronic switches Q1 and Q3 are turned on, the second electronic switch Q2 is turned off, therefore the phase pin 2PH is disabled. When the first phase switch signal A1 is a low voltage signal, such as 0V, the first and third electronic switches Q1 and Q3 are turned off, the second electronic switch Q2 is turned on, therefore the phase pin 2PH is enabled. The second sub-switch circuit 34 has the same working process to the first sub-switch circuit 32, and is therefore not described here.

In use, the BMC 20 receives the parameters of the memory module 10 and determines the required current to be supplied to the memory module 10 according to the parameters, and then outputs the corresponding first and second phase switch signals A1 and A2 to the phase switch circuit 30. The phase switch circuit 30 disables or enables the phase pins 2PH and 3PH of the PWM controller 40 according to the first and second phase switch signals A1 and A2. The table below shows the corresponding relationship among the number X of the memory chips of the memory module 10, the voltage states of the first and second phase switch signals A1 and A2, the number Y of the enable phase pins of the PWM controller 40, and the enabled phase pins of the PWM controller 40.

| X | A1 | A2 | Y | enabled phase pins |
|---|------|------|---|--------------------|
| 1 | High | High | 1 | 1PH                |
| 2 | High | Low  | 2 | 1PH, 2PH           |
| 3 | Low  | Low  | 3 | 1PH, 2PH, 3PH      |

According to the above table, the BMC 20 can be programmed to output corresponding first and second phase switch signals A1 and A2 to correspondingly control the phase pins 2PH and 3PH of the PWM controller 40 through the phase switch circuit 30. The phase pins of the PWM controller 40 can be adjusted before supplying current to the memory module 10, therefore can save electricity.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A memory power supply circuit comprising:
   a memory module;
   a micro control unit (MCU) operable to determine required current to be supplied to the memory module, and output corresponding phase switch signals;
   a phase switch circuit operable to receive the phase switch signals from the MCU; and
   a multi-phase pulse-width modulation (PWM) controller comprising a plurality of phase pins connected to the phase switch circuit, the phase switch circuit controlling enable states of the plurality of phase pins of the PWM controller according to the phase switch signals;
   wherein the phase switch circuit comprises a plurality of sub-switch circuits, the number of the plurality of sub-switch circuits is equal to the number of the phase switch signals of the MCU, each of the plurality of sub-switch circuits receives one corresponding phase switch signal of the MCU, and is connected to one corresponding phase pin of the PWM controller.

2. The memory power supply circuit of claim 1, wherein the MCU is a baseboard management controller or a basic input output system BIOS chip.

3. The memory power supply circuit of claim 1, wherein each of the plurality of sub-switch circuits comprises first to third electronic switches, a first resistor, and a second resistor, first terminals of the first and third electronic switches are connected to the MCU to receive the corresponding phase switch signal of the MCU, second terminals of the first and third electronic switches are grounded, a third terminal of the first electronic switch is connected to a first terminal of the second electronic switch and connected to a first voltage terminal through the first resistor, a second terminal of the second electronic switch is connected a third terminal of the third electronic switch and connected to the corresponding phase pin of the PWM controller, a third terminal of the second electronic switch is connected to a second voltage terminal through the second resistor; wherein the first and third electronic switches are turned on in response to the first terminals receiving a high voltage signal, the first and third electronic switches are turned off in response to the first terminals receiving a low voltage signal.

4. The memory power supply circuit of claim 3, wherein the first to third electronic switches are n-type field-effect transistors (FETs), the first to third terminals are corresponding to gates, sources, and drains of the n-type FETs.

\* \* \* \* \*